United States Patent
van der Valk et al.

(10) Patent No.: US 7,557,624 B2
(45) Date of Patent: Jul. 7, 2009

(54) FRACTIONAL DIGITAL PLL

(75) Inventors: Robertus Laurentius van der Valk, Capelle aan den Ijssel (NL); Paulus Hendricus Lodewijk Maria Schram, Bergen op Zoom (NL); Johannes Hermanus Aloysius de Rijk, Rotterdam (NL)

(73) Assignee: Zarlink Semiconductor Inc. (CA)

( * ) Notice: Subject to any disclaimer, the term of this patent is extended or adjusted under 35 U.S.C. 154(b) by 0 days.

(21) Appl. No.: 11/940,458

(22) Filed: Nov. 15, 2007

(65) Prior Publication Data

US 2008/0122504 A1 May 29, 2008

(30) Foreign Application Priority Data

Nov. 17, 2006 (GB) ................... 0622945.4

(51) Int. Cl.
*H03L 7/06* (2006.01)

(52) U.S. Cl. ....................... 327/156; 327/147

(58) Field of Classification Search ....... None
See application file for complete search history.

(56) References Cited

U.S. PATENT DOCUMENTS

| | | | | |
|---|---|---|---|---|
| 5,691,660 A | * | 11/1997 | Busch et al. | 327/147 |
| 5,703,540 A | * | 12/1997 | Gazda et al. | 331/16 |
| 5,825,253 A | * | 10/1998 | Mathe et al. | 331/18 |
| 5,945,881 A | | 8/1999 | Lakshmikumar | |
| 6,327,319 B1 | * | 12/2001 | Hietala et al. | 375/374 |
| 7,015,733 B2 | * | 3/2006 | Giuroiu | 327/156 |
| 7,095,260 B2 | * | 8/2006 | Miyata et al. | 327/156 |
| 7,148,764 B2 | * | 12/2006 | Kasahara et al. | 331/179 |
| 7,256,656 B2 | * | 8/2007 | Wu | 331/17 |

FOREIGN PATENT DOCUMENTS

| | | |
|---|---|---|
| EP | 1 104 111 A1 | 10/2000 |
| GB | 2 398 942 A1 | 12/2002 |

* cited by examiner

*Primary Examiner*—Cassandra Cox
(74) *Attorney, Agent, or Firm*—Lawrence E. Laubscher, Jr.

(57) ABSTRACT

A phase locked loop provides an output frequency that bears a fractional relationship to an input frequency and includes a controlled oscillator for generating the output frequency. The phase information is scaled in the amplitude domain to provide the fractional relationship.

17 Claims, 7 Drawing Sheets

FRACTIONAL DIGITAL PLL

FIELD OF THE INVENTION

This invention relates to the field of phase locked loops (PLLs), and in particular to digital phase locked loops.

BACKGROUND OF THE INVENTION

In PLL's it is quite common to use fractional relationships between the various frequencies, for example, for use with Forward Error Correction (FEC). The output frequency may be equal to M/N times the input frequency with M=255 and N=237. There are a few common methods to implement this fractional relationship, but those are in reality hampered by rather severe limitations in the final performance.

In generic block diagrams there are two that typically will be used to generate an output frequency that is M/N times the input frequency. There are other implementations possible if M/N can be simplified by getting rid of common denominators of M and N, but that would of course be equivalent to rewriting the M/N fraction to a simpler fraction.

Figure 1:
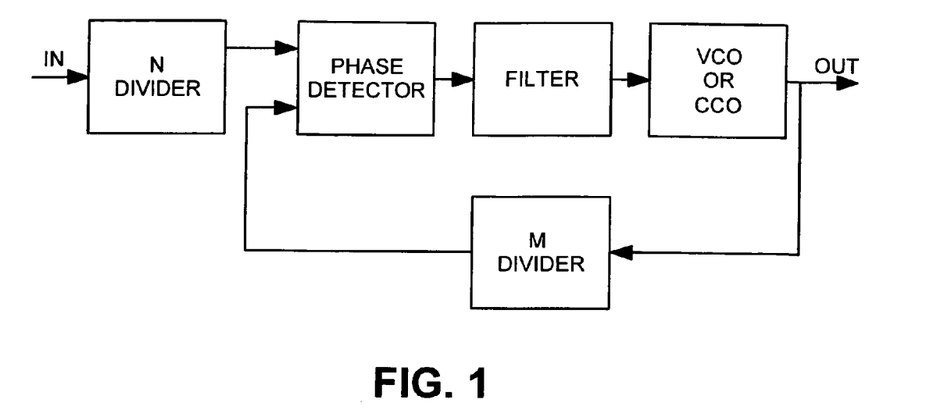
FIG. 1 is a block diagram of a PLL with N pre-division.

The first block diagram shown in FIG. 1 shows a pre-division by N, so that the 1/N of M/N is attained. The PLL has an M divider in the feedback, implying that the effective transfer of the loop only is M multiplication for frequency. Thus the output will run on M/N.

The disadvantage of this approach is that the edges from input signal are not well applied. The phase detector does not receive every edge from the input signal, but only 1 out of every N signals (the divider blocks the other edges so that their precise edge information gets lost). This implies:
  a) The frequency into the phase detector is lower, and so must the maximum bandwidth of the PLL transfer be lower.
  b) The reduced bandwidth is more difficult to implement. Typical filters will use a resistive element and a capacitive element, and a reduced bandwidth will typically increase the capacitor, up to a level where for instance integration is not feasible any more.
  c) The reduced bandwidth will decrease the suppression of noise from charge pump and VCO.
  d) In short: best overall jitter performance suffers from the N pre-division.

Figure 2:
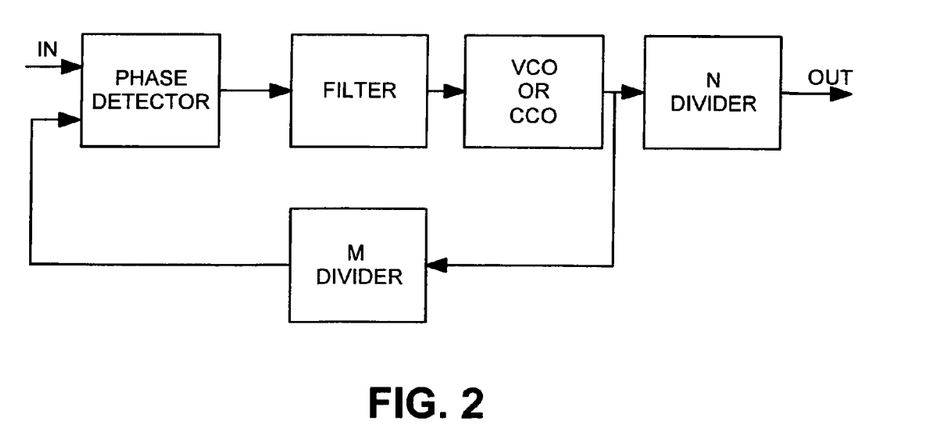
FIG. 2 is a block diagram of a PLL with post-division.

In the second block diagram shown in FIG. 2, the division is done after the PLL. Now the PLL runs with more edges being applied to the PLL, so that in a general sense the quality of the PLL remains constant without extra design effort in the charge pump, filter, VCO and the like. However, the cost is now that the output of the VCO or CCO is now running on an N times higher frequency. The disadvantages are apparent:
  a) There is a fair chance the VCO frequencies are no longer feasible. For example, consider the case of an input frequency of 16.384 MHz, N equal to 237 and M equal to 255. The real output frequency is still low (about 17.628 MHz), but now the VCO is required to run 4177.92 MHz, which is not trivial in a standard CMOS process. Of course the numbers can easily become even more extreme.
  b) Dividers that divide from the extremely high VCO frequency to lower frequencies become difficult to design.
  c) The power will rise due to the higher frequency requirement. Depending on implementation this may reduce the quality. For instance in an integrated VCO the higher power consumption will influence other VCO's in the system.

In short, both traditional systems have their problems, and it would be attractive to have an alternative technique that does not have same limitations.

SUMMARY OF THE INVENTION

According to a first aspect of the invention there is provided a phase locked loop providing an output frequency that bears a fractional relationship to an input frequency, comprising a controlled oscillator for generating the output frequency; a feedback loop coupled to the output of the controlled oscillator and generating a feedback signal; a phase detector for comparing an input signal with the feedback signal, said phase detector providing phase information in the amplitude domain; and a scaling stage for scaling said phase information in the amplitude domain to produce said desired output frequency.

In embodiments of the invention, a pulsed input signal is unsampled and all edges from the input signal are active in the phase detector (so no pre-division) and yet have limited frequencies out of the frequency generating element or controlled oscillator such a a VCO (Voltage Controlled oscillator).

In one embodiment an input signal is applied to a MOD N counter, a feedback signal is applied to a MOD M counter, the outputs of said counters are applied to respective first and second scaling units, the first scaling unit applies an M/N scaling factor, and the outputs of said scaling units are applied to a subtractor, where N and M are integers.

Embodiments of the invention perform scaling in the amplitude domain, rather than the time domain as in the prior art. This allows the PLL to have maximum bandwidth relative to the input frequency. Embodiments of the invention are able to input every edge of the input signal into the phase detector, unlike in prior art arrangements where only certain edges are input into the phase detector. This also avoids jitter problems that arise when performing such operations in the time domain.

In another aspect the invention provides a phase locked providing an output frequency that bears a fractional relationship to an input frequency, comprising an input stage comprising a sampling unit, a counter and a decimator; and an output stage comprising a controlled oscillator for generating the output frequency; a feedback loop providing a feedback signal from the output of said controlled oscillator, and a scaling stage for scaling phase information to provide said fractional relationship, and wherein the input stage is implemented in hardware and the output stage is implemented in software.

BRIEF DESCRIPTION OF THE DRAWINGS

The invention will now be described in more detail, by way of example only, with reference to the accompanying drawings, in which:—

DETAILED DESCRIPTION OF THE PREFERRED EMBODIMENTS

Figure 3:
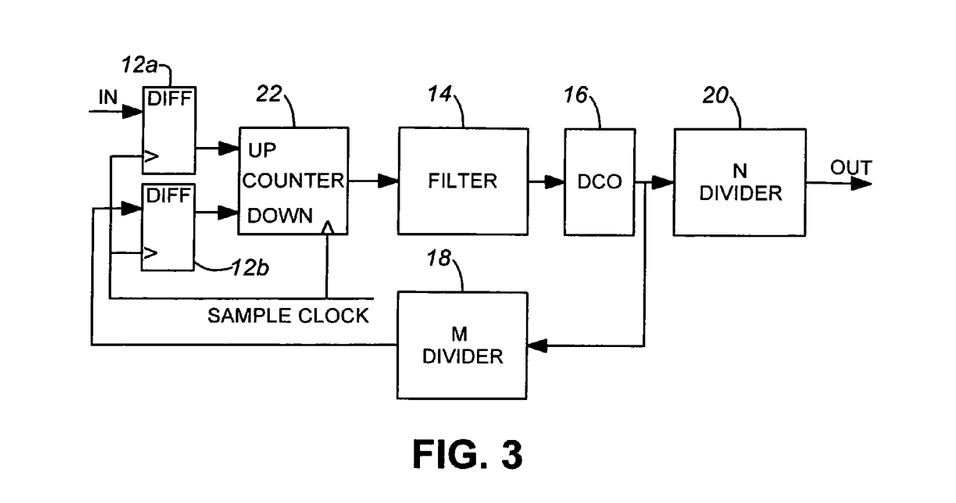
FIG. 3 is a block diagram of a digital PLL with sampled phase detector.

In order to understand the invention, reference will be made to a subclass of PLL's of the type shown in FIG. 3. In such a PLL, the incoming signal is first sampled in unit 12 before being applied to the phase detector 22, which is in the form of an updown counter. In this case, the phase detector is a counter 22 that represents the phase difference up to an extended number of cycles. In the filter this phase difference may be processed, possibly with required decimation, and the PI operation (Proportional-Integral control).

The size of the counter 22 forming the phase detector determines the maximum range of phase difference for the whole PLL if proper precautions are taken against overflows of that counter. The controlled oscillator 16 is a digitally controlled oscillator (DCO), which encompasses a whole class of known frequency generating elements.

The feedback loop contains a divided-by-M 18 and the output of the DCO 16 is applied to the input of a divider-by-N 20.

Figure 4:
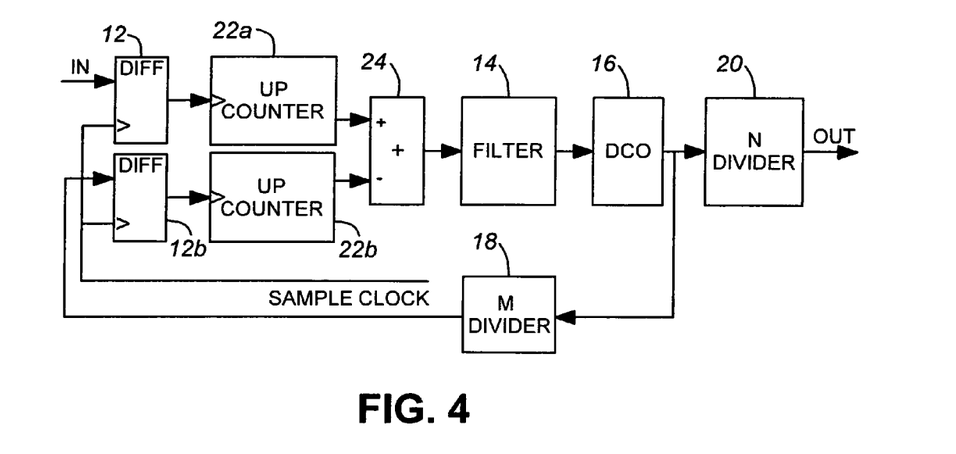
FIG. 4 is a block diagram of a digital PLL with separate phase counters.

The digital PLL can be slightly changed to perform the same function, but now in a slightly changed format as illustrated in the block diagram of FIG. 4. Here instead of detecting the phase difference with an up/down counter, the phase difference counter is split up in two up counters 22a, 22b and a subtraction unit 24 to produce the same phase difference. The output of the subtraction unit 24 is applied to the filter 14 in the same way as in FIG. 3.

Figure 5:
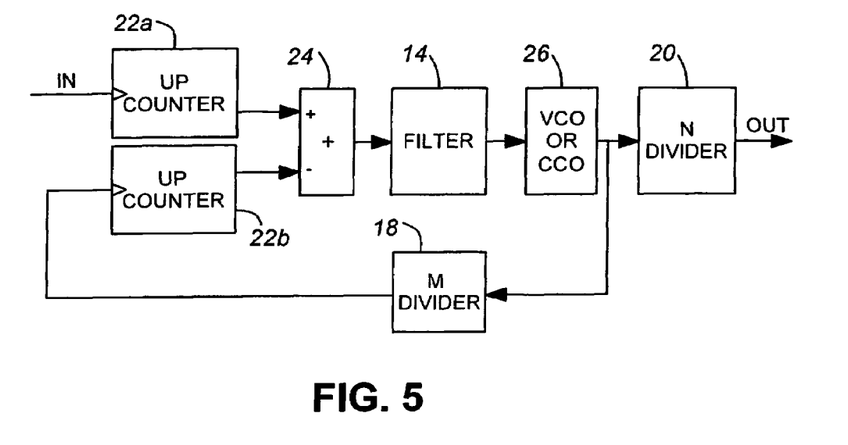
FIG. 5 is a block diagram of a PLL with separate phase counters.

If for a moment the sampling is ignored, since this can be considered just to be a clock domain transition, the circuit of FIG. 4 can be represented in equivalent analog terms as shown in FIG. 5. In this diagram the clock domains are not taken into consideration but that can be taken into account with conventional techniques. The DCO of FIG. 4 is replaced in this Figure by the VCO 26.

What can be observed in FIG. 5 is that for single bit phase counters the subtraction operation performed by unit 24 becomes very close to an EXOR operation because the unit 24 only produces an output when the count stored in the counters 22a, 22b is different. This shows the logical connection to more traditional PLL's.

In the block diagram of FIG. 5, all edges on the input feed into the loop in the time domain so that their precise time information does not get lost. The bandwidth of the PLL can remain quite large, which is attractive.

The information after the counters now spans a larger phase than is the case in the embodiment of FIG. 1. Such a phase detector would generally be designed to handle a phase range between $-\pi$ and $+\pi$, while in circuit of FIG. 5, the range would need to be ± many $\pi$. If this information is present in the voltage domain, as would be the case for a voltage controlled oscillator there would more than two or three levels would be required. A phase detector may supply for instance 0, 1 and tri-state as applicable levels, which makes the step size for each phase change on the inputs smaller. However, that information is now in the amplitude domain, rather than in the time domain anymore.

In the amplitude domain it is relatively simple to perform modulo (MOD) and multiplication operations, which in the time domain would require large blocks that are difficult to design.

Figure 6:
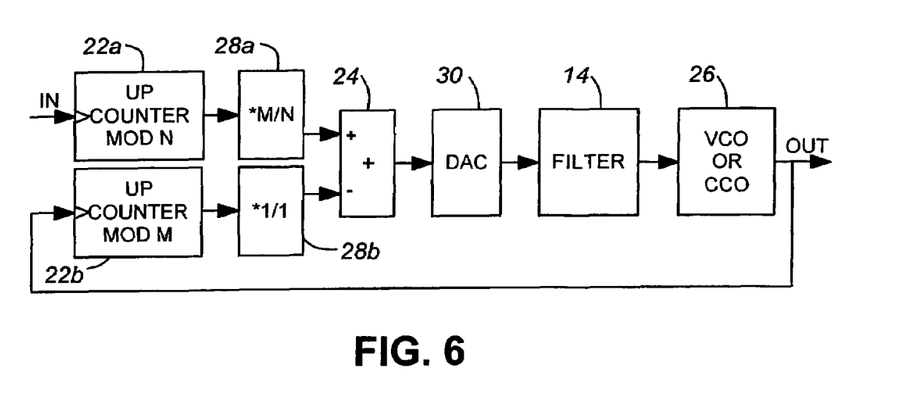
FIG. 6 is a block diagram of a PLL with limited accuracy scaling on the input.

FIG. 6 shows an embodiment of the invention wherein a scaling stage 28a, 28b is added and the dividers are removed. As in FIG. 5, the input is unsampled. The output of the subtraction unit 24 is applied to a digital-to-analog converter 30, which in turn is connected to filter, whose output is applied to VCO or CCO 26.

The M/N scaling stage 28a divides the phase angle by N and multiplies it by M. Thus the phase line after the scaling appears to run at a frequency that is M/N times the input frequency. The feedback frequency must be comparable with the scaled frequency, which was the sought after output frequency. The feedback frequency will be scaled with unity.

The multipliers generally have a limited accuracy, but that implicit problem can actually be well contained. The range from the input counters 22a, 22b is limited by the MOD operators. Thus the multiplications in the scaling units 28a, 28b will impart only a limited error, which can be designed to sufficiently low levels which are satisfactory for the overall performance of the PLL.

In the longer term the two MOD operators (N and M) will force the appropriate frequency behavior. For every N input cycles the output will have M/N*N=M output cycles, which can be handled by the M MOD operator. Thus, long term the errors in scaling cannot accumulate as the counters will incur the same quantities of actual MOD activations if the input and the output are correctly locked.

The above embodiment thus provides a robust method to generate an output frequency which is M/N*input frequency without the use of time dividers. Off course there, many variants of this method are possible.

Figure 7:
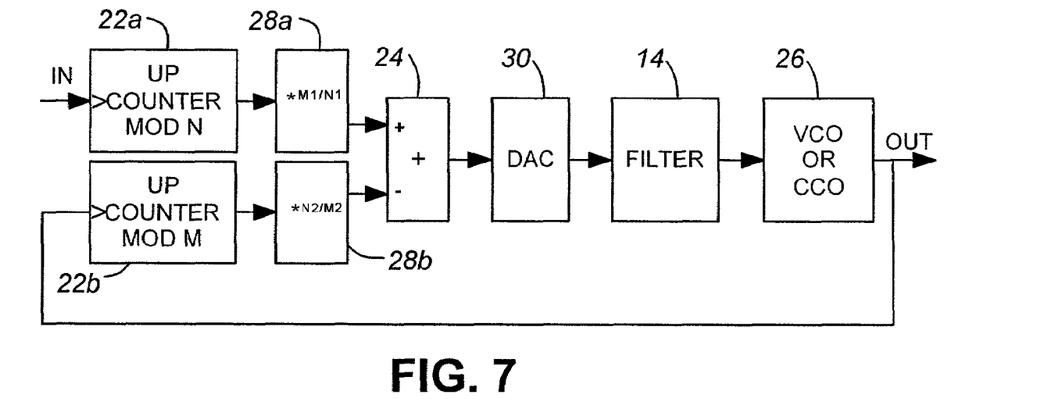
FIG. 7 is a block diagram of a PLL with limited accuracy scaling on the input and feedback.

The scaling factors can be changed around. For instance could the scaling factors be M for the input and N for the feedback, which could give implementation advantages. In general the input scaling could be M1/N1, and the feedback scaling N2/M2. This would lead to a total frequency transfer of M1*M2/N1*N2. A block diagram of such an arrangement is shown in FIG. 7.

In another embodiment, the MOD operators with the same integer factor can be changed so that the phase range is changed (expanded).

Figure 8:
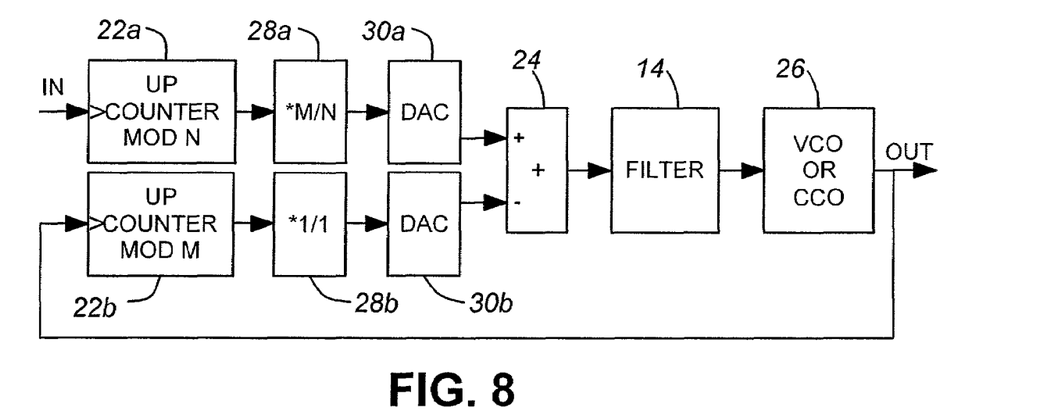
FIG. 8 is a block diagram of a fractional PLL with an alternative block diagram.
Figure 9:
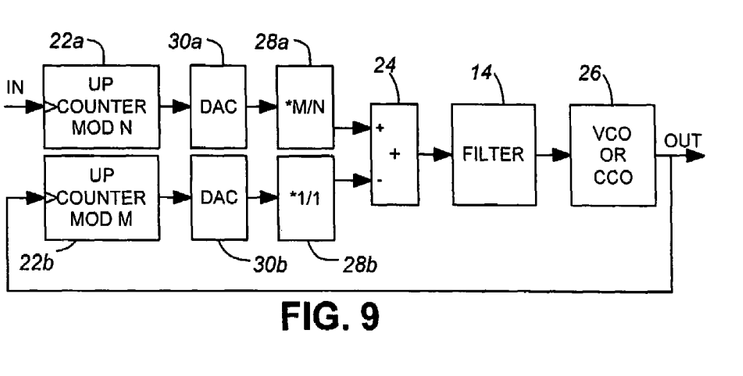
FIG. 9 is a block diagram of a fractional PLL with an alternative block diagram.

In another embodiment the subtraction unit is arranged downstream of a pair of DACs 30a, 30b, as shown in FIG. 8. When the DACs are located upstream of the subtraction unit 24, two DAC's are required as shown. The scaling can be in the analog or the digital domain. In FIG. 8, the scaling is in the analog domain, whereas in FIG. 9 shows an embodiment wherein the scaling occurs in the digital domain. In this case, the MOD units 28a, 28b are located downstream of the DACs 30a, 30b.

Figure 10:
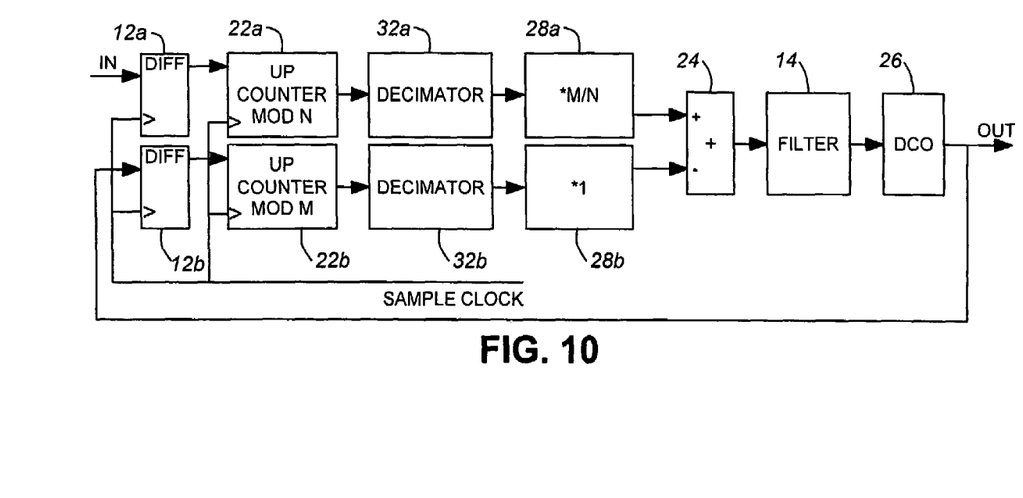
FIG. 10 is a block diagram of a digital fractional PLL with scaling.

In the embodiments described above, the input blocks have been sequenced slightly different. It is also possible to include part of the filtering operation, such as decimation, in the input stage. FIG. 10 illustrates such an embodiment, where decimators 32a and 32b are included upstream of the MOD units 30a, 30b.

The introduction of a decimator into the block diagram useful to implement part of the PLL function in software. Software typically cannot operate at the speed of the incoming edges of the input signal, so that decimation down to a lower signal rate is necessary. The embodiment shown in FIG. 10 is simple to implement in software, wherein the part downstream of the decimation is implemented in software.

Figure 11:
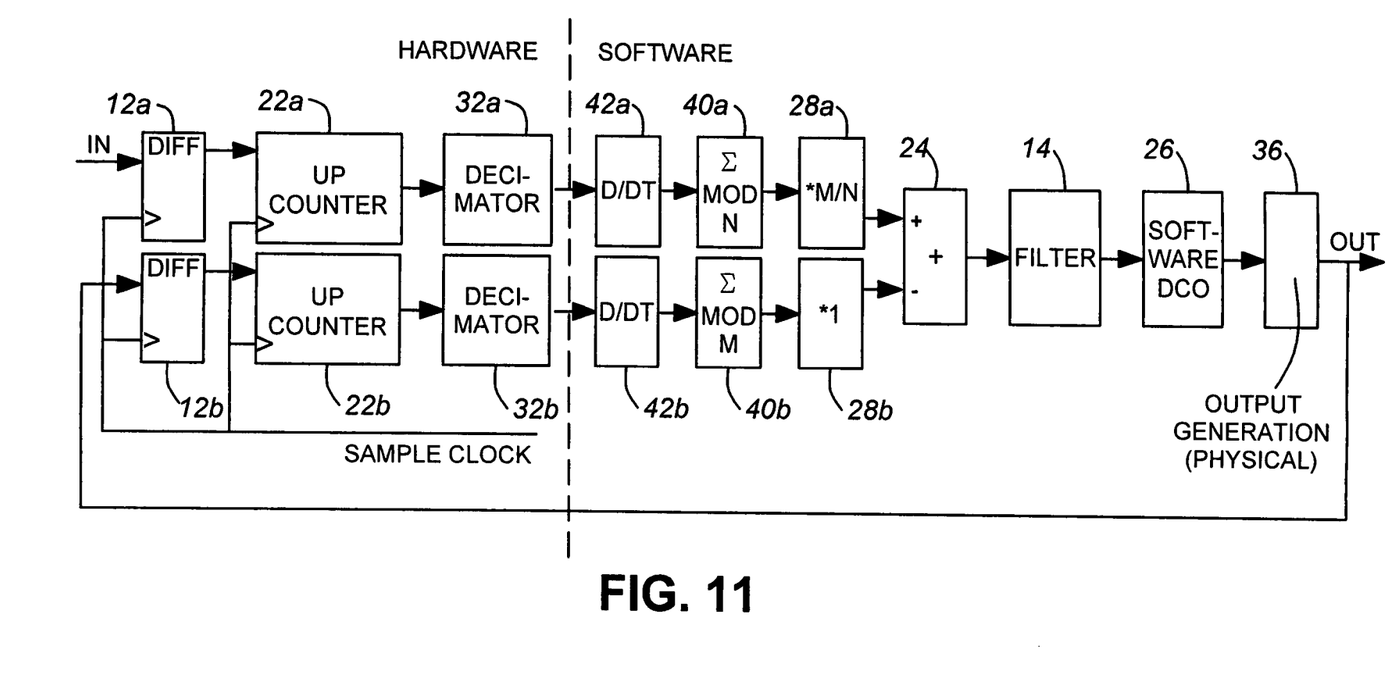
FIG. 11 is a block diagram of a digital fractional PLL with partial software implementation.

It is also possible to expand this operation by including the MOD operation in software. In this approach the hardware that counts the edges on the inputs can have almost any MOD operator (there will be an implicit one anyhow as the hardware will have limited size of memory), and the software can performs its own MOD operator by using a differentiator plus an integrator, the latter inclusive of the MOD operator. This approach leads to the implementation shown in FIG. 11. In this embodiment, the input counters 28a, 28b are simple up counters. Mod units 40a, 40b are placed between differentiators 42a, 42b.

Figure 12:
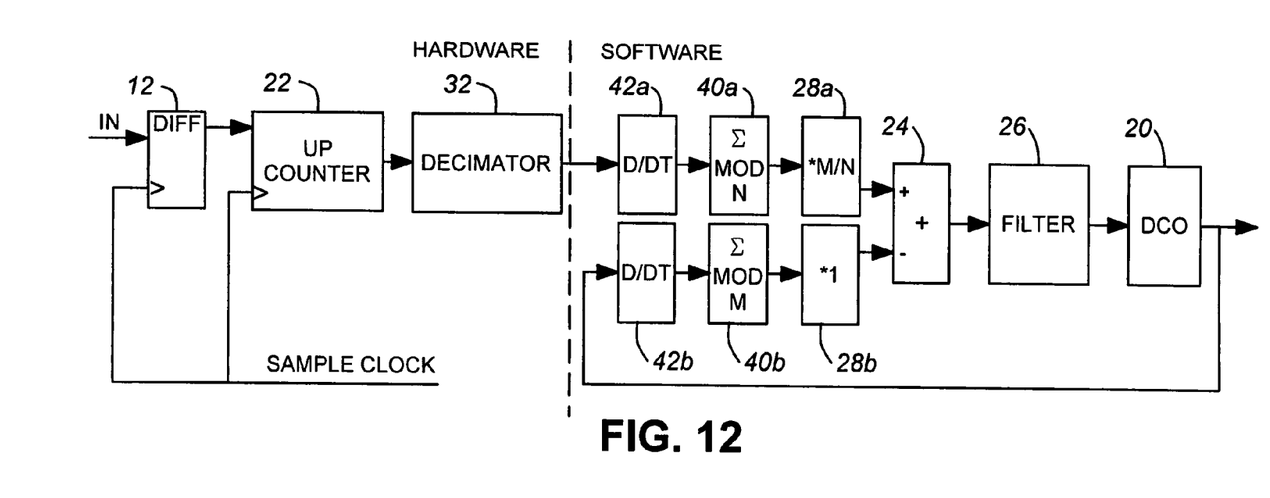
FIG. 12 is a block diagram of a digital fractional PLL with maximized software implementation.

The information in the DCO is represented by the output signal, sampled and processed again. Actually that information is already present in the DCO, and the presence of a physical representation of the information somewhere in the feedback is actually not required. Another embodiment of the invention can be as illustrated in FIG. 12. In this embodiment, a single up counter 28 feeds a single decimator 22. The sampling unit 22, the up counter 28 and the decimator 32 are implemented in hardware. The remaining part of the PLL is implemented in software.

The feedback is replaced by a software path, which means that the unit requires less hardware that uses area and power, and that the hardware is as simple as possible, so for instance without a programmable MOD operator. This makes this embodiment highly attractive for many applications.

The embodiment in FIG. 12 is missing a physical output signal. However, it is well how to convert a software DCO running at a certain frequency into a hardware generated signal. This actually can be performed with frequency conversions so that it is possible to generate several signals from a single software PLL. It is apparent that in this embodiment the actual PLL loop is contained completely in software. This implies that the software also supplies full flexibility on the actual transfer curves.

Figure 13:
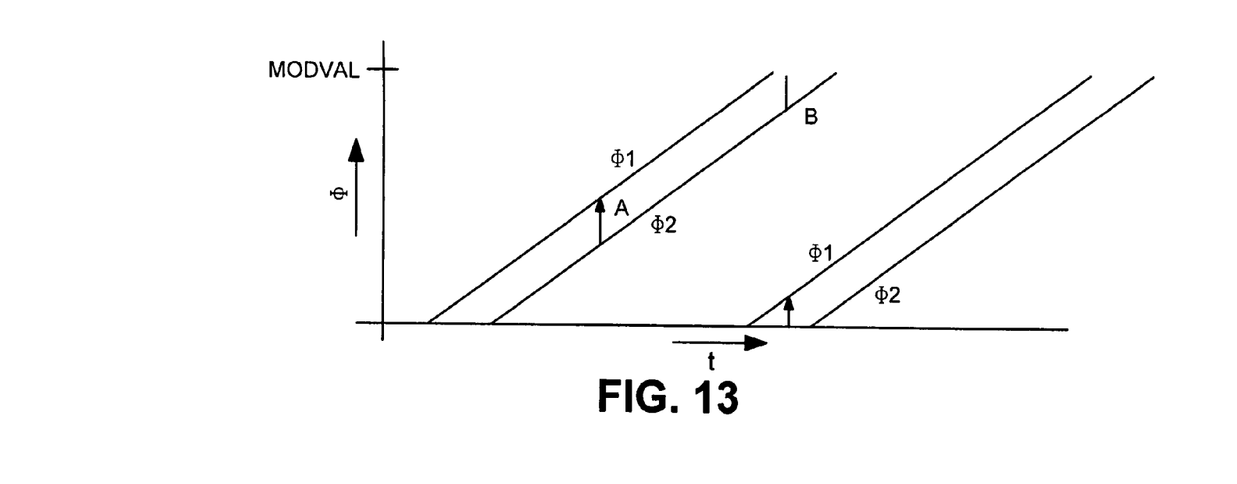
FIG. 13 is a diagram illustrating a potential problem in an overflow situation with a sawtooth shaped phase signal.

The MOD operators make the phase signal change from a straight sloping line into a sawtooth signal. The subtraction of the scaled sawtooth shaped signals may create overflow problems as demonstrated in FIG. 13. A first phase difference of the scaled phases is found ts A, which in size is $\Phi 1 - \Phi 2$. If the same operation is performed at B that subtraction will become very negative, as the $\Phi 1$ line is already over the 'MOD top' while the $\Phi 2$ line is not. The mathematical solution to this problem is to switch at B to $\Phi 1 - \Phi 2 +$ modval. In software or digital solutions that is a numerical operation; in an analog environment it involves the use of extra current.

The invention claimed is:

1. A phase locked loop providing an output frequency that bears a fractional relationship to a frequency of an input signal, comprising:
    a controlled oscillator for generating the output frequency;
    a feedback loop coupled to the output of the controlled oscillator and generating a feedback signal; and
    a phase detector for comparing the input signal with the feedback signal to generate a phase signal for controlling the controlled oscillator, said phase detector comprising a modulo N counter and a modulo M counter, where N and M are integers, one of said counters receiving the input signal and the other of said counters receiving the feedback signal, and wherein the outputs of said counters are applied to respective first and second scaling units, the first scaling unit applying an M/N scaling factor, and the outputs of said scaling units being applied to a subtractor to provide the phase signal, whereby said phase detector includes a scaling stage for scaling said phase information in the amplitude domain to produce the desired output frequency.

2. A phase locked loop as claimed in claim 1, wherein said modulo N and modulo M counters are up counters.

3. A phase locked loop as claimed in claim 1, wherein the second scaling unit applies a unity scaling factor.

4. A phase locked loop as claimed in claim 1, wherein the first scaling unit applies an M1/N1 scaling factor, the second scaling unit applies an N2/M2 scaling factor, where N2 and M2 are integers different from N1 and M1.

5. A phase locked loop as claimed in claim 1, wherein the output of the subtraction unit is applied to a digital-to-analog converter.

6. A phase locked loop as claimed in claim 1, wherein the outputs of the counters are passed through respective digital-to-analog converters prior to being applied to said subtraction unit.

7. A phase locked loop as claimed in claim 6, wherein said digital-to-analog converters are upstream of said scaling units.

8. A phase locked loop as claimed in claim 6, wherein said digital-to-analog converters are downstream of said scaling units.

9. A phase locked loop as claimed in claim 1, wherein the input signal is unsampled.

10. A phase locked loop as claimed in claim 1, wherein the input signal is applied to the modulo N counter via a sampling unit, the feedback signal is applied to the modulo M counter via a sampling unit, and the outputs of said counters are coupled to said first and second scaling units through respective decimators.

11. A phase locked loop as claimed in claim 10, wherein said second scaling unit applies a unity scaling factor.

12. A phase locked loop providing an output frequency that bears a fractional relationship to a frequency of an input signal, comprising:
    a controlled oscillator for generating the output frequency;
    a feedback loop coupled to the output of the controlled oscillator and generating a feedback signal; and
    a phase detector for comparing the input signal with the feedback signal to generate a phase signal for controlling the controlled oscillator; and
    wherein the phase detector comprises:
    a first up counter receiving an input signal via a sampling unit, a second up counter receiving a feedback signal via a sampling unit, and the outputs of said first and second up counters are applied through respective decimators and differentiators to respective modulo M and modulo N adders, which are in turn coupled to respective first and second scaling units, the first scaling unit applying an M/N scaling factor, and the outputs of said scaling units being applied to a subtractor to provide the phase signal, whereby said phase detector includes a scaling stage for scaling said phase information in the amplitude domain to produce the desired output frequency.

13. A phase locked loop as claimed in claim 12, wherein the second scaling unit applies a unity scaling factor.

14. A phase locked loop providing an output frequency that bears a fractional relationship to a frequency of an input signal, comprising:
    a controlled oscillator for generating the output frequency;
    a feedback loop coupled to the output of the controlled oscillator and generating a feedback signal; and
    a phase detector for comparing the input signal with the feedback signal to generate a phase signal for controlling the controlled oscillator; and a filter for filtering the phase signal; and wherein the phase detector comprises an up counter receiving the input signal via a sampling unit, a decimator receiving the output of the sampling unit, a modulo N adder coupled to the output of the decimator, a first M/N scaling unit coupled to the output of the modulo N adder, where N and M are integers, a subtraction unit coupled to the output of the first M/N scaling unit, and a modulo M adder whose output is applied to a second scaling unit whose output is applied to the subtractor, whereby said phase detector includes a scaling stage for scaling said phase information in the amplitude domain to produce the desired output frequency.

15. A phase locked loop as claimed in claim 14, further comprising respective differentiators upstream of said modulo M and modulo N adders.

16. A phase locked loop as claimed in claim 14, wherein the sample unit, up counter and decimator are implemented in hardware and the remainder of the phase locked loop is implemented in software.

17. A phase locked loop as claimed in claim 16, wherein the second scaling unit applies a unity scaling factor.

* * * * *